United States Patent
Park

[11] Patent Number: 6,033,954
[45] Date of Patent: Mar. 7, 2000

[54] METHOD OF FABRICATING FLASH MEMORY CELL

[75] Inventor: Young-Keun Park, Chungcheongbuk-do, Rep. of Korea

[73] Assignee: LG Semicon Co., Ltd., Cheongju, Rep. of Korea

[21] Appl. No.: 08/908,922

[22] Filed: Aug. 8, 1997

[30] Foreign Application Priority Data

Dec. 28, 1996 [KR] Rep. of Korea ...................... 96-75703

[51] Int. Cl.⁷ .................................................. H01L 21/336
[52] U.S. Cl. ............................................ 438/257; 438/263
[58] Field of Search ..................................... 438/257, 262, 438/263, 289, 307, 258, 259, 261, 264

[56] References Cited

U.S. PATENT DOCUMENTS

| | | | |
|---|---|---|---|
| 3,984,822 | 10/1976 | Simko et al. | 438/257 |
| 3,996,657 | 12/1976 | Simko et al. | 438/257 |
| 4,282,540 | 8/1981 | Ning et al. | 257/316 |
| 4,780,424 | 10/1988 | Holler et al. | 438/257 |
| 4,895,520 | 1/1990 | Berg | 438/289 |
| 4,964,143 | 10/1990 | Haskell | 257/316 |
| 5,091,326 | 2/1992 | Haskell | 438/257 |
| 5,120,671 | 6/1992 | Tang et al. | 438/257 |
| 5,120,672 | 6/1992 | Mitchell et al. | 438/261 |
| 5,342,803 | 8/1994 | Shimoji | 438/526 |
| 5,661,053 | 8/1997 | Yuan | 438/257 |
| 5,707,897 | 1/1998 | Lee et al. | 438/257 |
| 5,773,343 | 6/1998 | Lee et al. | 438/259 |

*Primary Examiner*—Charles Bowers
*Assistant Examiner*—Jack Chen
*Attorney, Agent, or Firm*—Fleshner & Kim

[57] ABSTRACT

A method of fabricating a flash memory cell includes the steps of ion-implanting impurity into a substrate to form a buried region having a striped shape extending in a first direction (Y), depositing an insulating layer on the substrate and selectively etching the insulating layer to form a field insulating layer and a plurality of contact holes that expose the substrate in a matrix form. The method further includes forming a gate insulating layer on the exposed substrate in the contact holes, forming self-aligned floating gate on the gate insulating layer in the contact holes, forming an interlevel insulating layer on the floating gate, and forming a plurality of control gates having a striped shape extending in a second direction (X) that crosses the first direction on the interlevel insulating layer.

21 Claims, 4 Drawing Sheets

METHOD OF FABRICATING FLASH MEMORY CELL

BACKGROUND OF THE INVENTION

1. Field of the Invention

The present invention relates to a method of fabricating a memory cell, and more particularly, to a method of fabricating a flash memory cell.

2. Background of the Related Art

A flash memory cell, which has a laminated structure of a floating gate and a control gate, is a nonvolatile memory device. The flash memory cell is programmed when hot electrons are injected into the floating gate, and is erased when the electrons of the floating gate are tunneled to a source region or a substrate with a Fowler-Nordheim mechanism. The flash memory cell has a high erase rate because the memory array cells can be concurrently erased.

FIG. 1 is a layout of the flash memory cell of the related art. The flash memory cell includes a buried region 13, a field insulating layer 15, a floating gate 19 and a control gate 23. The buried region 13, which is used as data lines, is formed in a stripe shape in a first direction, and the field insulating layer 15 for defining an active region of the device is formed in a stripe shape in a second direction, which crosses the first direction. The control gate 23 is formed in the second direction on the active region between the field insulating layers 15. The floating gate 19 is overlapped with the control gate 23. Furthermore, the edged portions on both sides of the floating gate 19 overlap with the buried region 13 adjacent thereto.

FIGS. 2A–2D are flow diagrams illustrating the process for fabricating a flash memory cell in accordance with the related art, which show sectional views taken along the line II–II' of FIG. 1.

Referring to FIG. 2A, a mask layer 12 is formed by depositing a silicon oxide or a silicon nitride on a P-type substrate 11 using chemical vapor deposition (CVD). The mask layer 12 is patterned with photolithography to expose the substrate 11 in a stripe shape in the first direction. Then, an N-type impurity such as phosphorus (P) or arsenic (As) is ion-implanted into the exposed portion of the substrate 11 to form the buried region 13.

Referring to FIG. 2B, the mask layer 12 is removed. Then, the field insulating region 15 for defining an active region of device is formed on the field region of the substrate 11 using Local Oxidation of Silicon (LOCOS), and it is formed in a stripe shape in the second direction crossing the buried region 13.

As shown in FIG. 2C, a thermal oxidation is performed on the exposed portion of the substrate 11 to form the gate oxide layer 17. After a polysilicon doped with impurity is deposited on the field insulating layer 15 and the gate oxide layer 17 with CVD, the deposited polysilicon is patterned in a stripe shape in the first direction with photolithography to form the floating gate 19. The edge on both sides of the floating gate 19 overlaps the buried region 13 adjacent to the active region.

As illustrated in FIG. 2D, an interlevel insulating layer 21 is formed by carrying out an oxidation on the surface of the floating gate 19. Then, a polysilicon doped with impurity and a silicon oxide are sequentially deposited on the field and interlevel insulating layers 15 and 21 with CVD. The polysilicon and the silicon oxide are patterned with photolithography so as to remain in a stripe shape in the second direction only in the active region of device, and thus, the control gate 23 and a cap oxide layer 25 are formed. In the meantime, the portion formed on the field insulating layer 15 of the by floating gate 19 is removed.

The flash memory cell as fabricated in the above method, is programmed when, with a buried region 13, used as a source, coupled to ground, a voltage Vg applied to the control gate 23 is higher than the voltage Vd (i.e., Vg>Vd) applied to another buried region 13 used as a drain region. Thus, hot electrons generated in the channel are injected into the floating gate 19. To erase programmed data in the flash memory cell, the voltage Vs is applied to the buried region used as the source with the control gate 23 grounded, or with negative voltage applied. Thus, the electrons in the floating gate 19 are tunneled to the buried region 13 used as the source region, or the substrate 11.

However, the above-described flash memory cell of the related art method has various disadvantages because the fabrication method is too complex in that the field insulating layer and the floating gate are formed through separate steps. Further, the floating gate is formed with two etching steps. Moreover, it is difficult to enhance the integration of a device using such flash memory cells because of the required space to align the floating gate with the field insulating layer during the step of forming the floating gate.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

Another object of the present invention is to provide a method of fabricating a flash memory cell having a reduced number of processes.

Another object of the present invention is to provide a method of fabricating a flash memory cell to enhance the integration of the device by the self-alignment of the floating gate with the field insulating layer.

To achieve at least these and other objects and advantages in whole or in part and in accordance with the purpose of the present invention, as embodied and broadly described, a method of fabricating a flash memory cell, includes the steps of ion-implanting impurity into a substrate so as to form a buried region having a striped shape in a first direction, depositing an insulating layer on the substrate and selectively etching, the insulating layer to form a field insulating layer and a contact hole, the substrate exposed in a matrix form by the contact hole, forming a gate insulating layer on the exposed substrate, forming a floating gate on the gate insulating layer, forming an interlevel insulating layer on the floating gate, and forming a control gate having a striped shape in a second direction that crosses with the first direction on a field oxide layer and the interlevel insulating layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
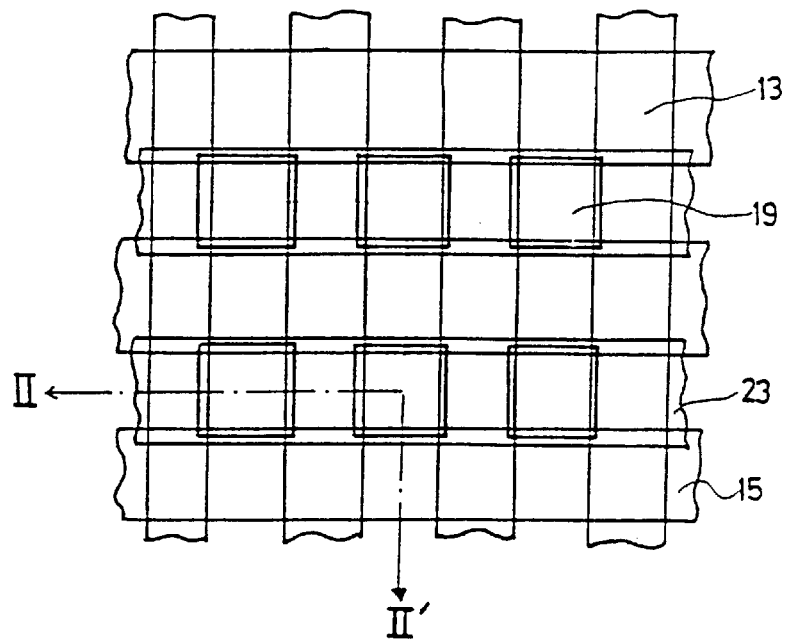
FIG. 1 is a diagram showing a layout of a related art flash memory cell.
Figure 2A:
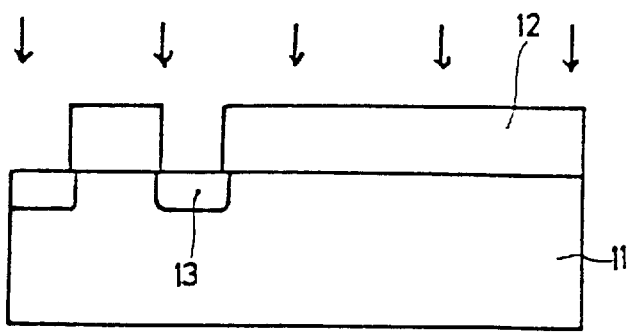
FIGS. 2A–2D are diagrams illustrating a fabricating method for the flash memory cell of FIG. 1.
Figure 2B:
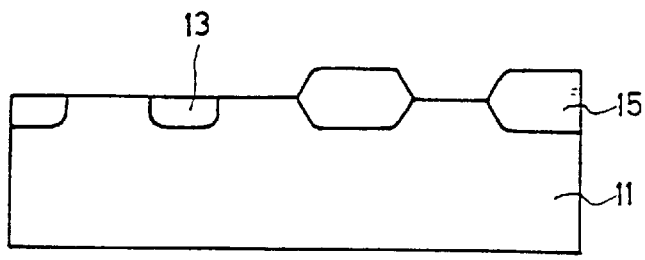
Figure 2C:
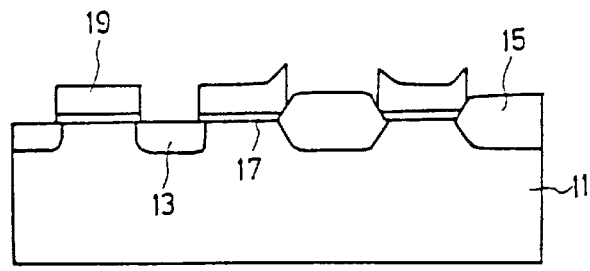
Figure 2D:
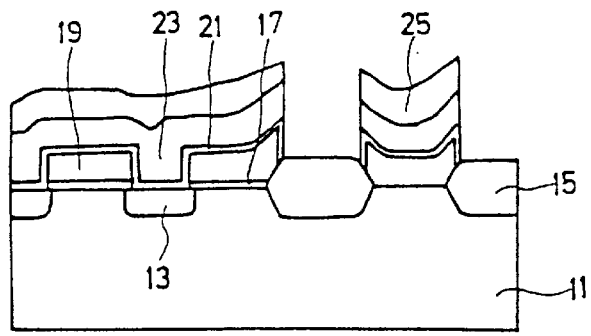
Figure 3:
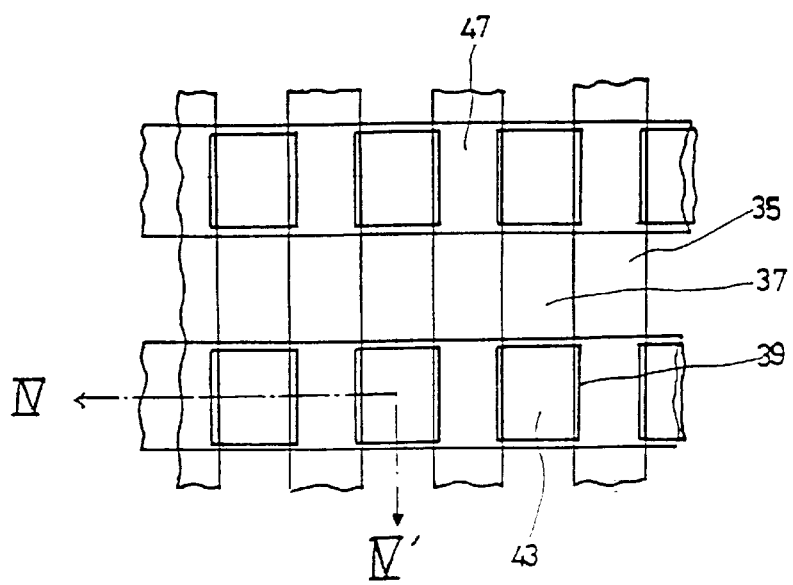
FIG. 3 is a diagram illustrating a layout of preferred embodiment of a flash memory cell according to the present invention.

FIG. 3 shows a layout of a first preferred embodiment of a flash memory cell according to the present invention. The flash memory cell includes a buried region 35, a field insulating layer 37, a contact hole 39, a floating gate 43 and a control gate 47. The buried region 35, which is used as a data line, is formed in a stripe shape in a first direction, and the control gate 47 is formed in a stripe shape in a second direction, which crosses the first direction. Preferably the first direction is substantially perpendicular to the second direction. The field insulating layer 37 defining the active region of a device is formed in a portion other than the contact hole 39, which is formed between the buried regions 35 under the control gate 47. The floating gate 43 is overlapped by the control gate 47 inside the contact hole 39. Further, each floating gate's bilateral edges overlap the adjacent buried regions 35.

FIGS. 4A–4D are diagrams illustrating a preferred embodiment of a method for fabricating a flash memory cell in accordance with the present invention and show sectional views taken along the line IV–IV' of FIG. 3.

Figure 4A:
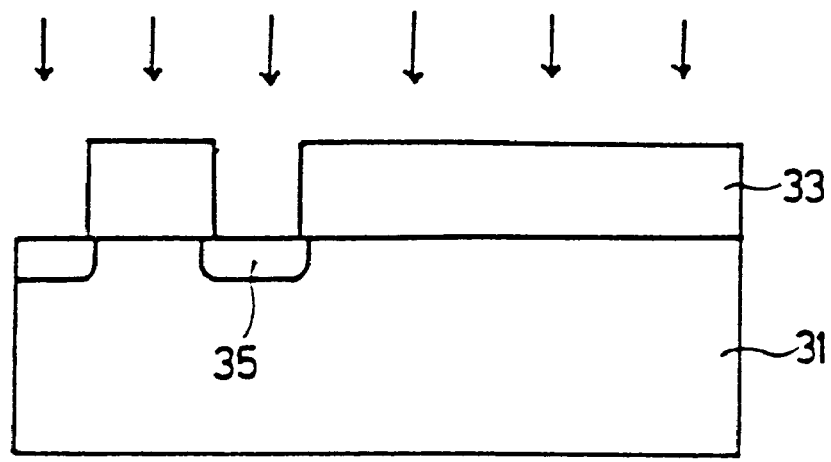
FIGS. 4A–D are diagrams illustrating a fabricating method for the flash memory cell of FIG. 3.

Referring to FIG. 4A, mask layer 33 is preferably formed by depositing a silicon oxide or a silicon nitride as thick as 3000 to 5000 Å on a P-type substrate 31 with the CVD method. The mask layer 33 is patterned with photolithography to expose the substrate 31 in a stripe shape in a first direction. Then, a buried region 35 is preferably formed by ion-implanting an N-impurity such as phosphorus (p) or arsenic (As) by about $10^{15}$ to $10^{16}/cm^2$ dose with energy of about 30 to 50 KeV on the exposed portion of the substrate 30.

Figure 4B:
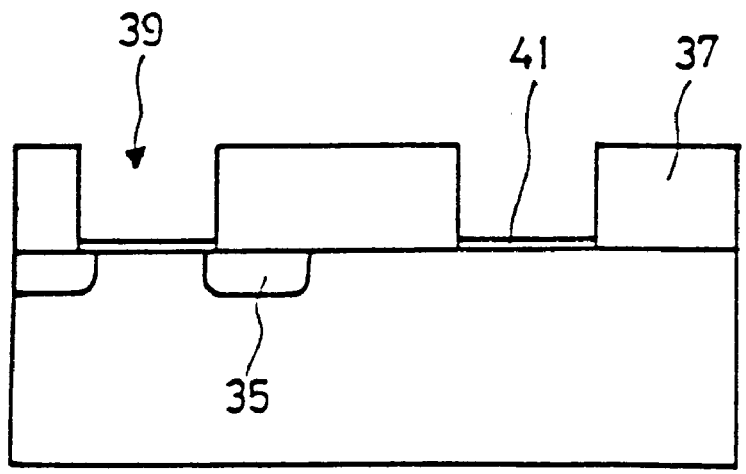

Referring now to FIG. 4B, the mask layer 33 is removed. Then, a field insulating layer 37 is preferably formed by depositing a silicon oxide by 4000 to 6000 Å in thickness on the entire surface of the substrate 31. Next, the field insulating layer 37 is patterned with photolithography to expose the substrate 31 and thus form a plurality of contact holes 39 in a matrix form. The bilateral edges of the contact hole 39 overlap the adjacent buried regions 35. Then, a thermal oxidation is preferably performed on a part of the substrate 31 exposed by the contact hole 39 to form a gate oxide layer 41 200 to 400 Å in thickness.

Figure 4C:
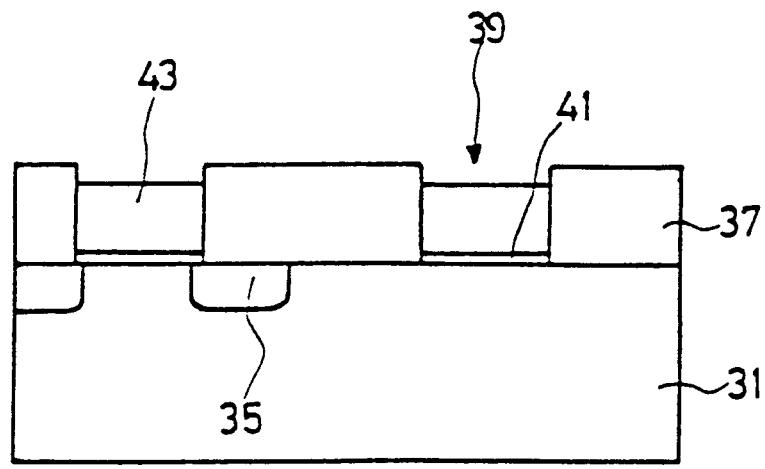

As shown in FIG. 4C, a polysilicon doped with impurity is deposited preferably using CVD on the field insulating layer 37 to fill the contact hole 39 and an etch back is performed preferably using anisotropic etching such as reactive ion etch to expose the field insulating layer 37. At this time, the polysilicon remaining in the contact hole 39 forms a floating gate 43 and thus the floating gate 43 self-aligns with the contact hole 39. Both sides of the floating gate 43 overlap the adjacent buried regions 35.

Figure 4D:
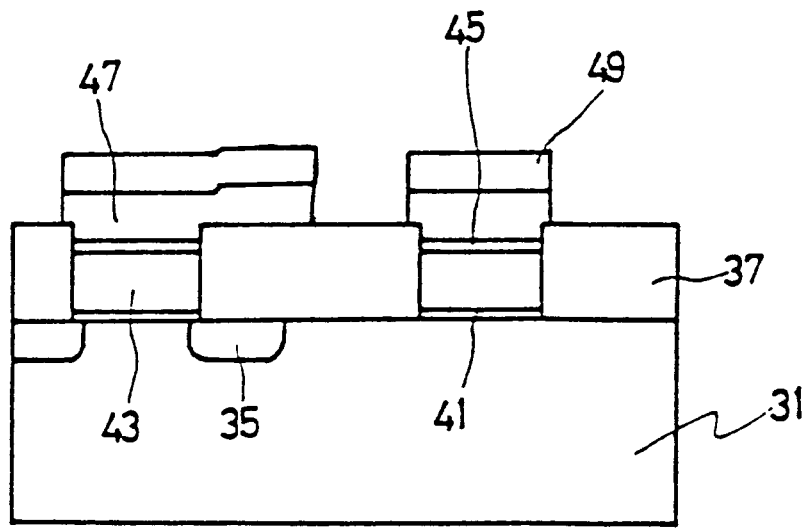

Referring to FIG. 4D, a thermal oxidation is performed on the surface of the floating gate 43 or a silicon oxide is deposited using CVD followed by a thermal oxidation to preferably form an interlevel insulating layer 45, which is 300 to 500 Å in thickness. Then, preferably a polysilicon doped with impurity and a silicon oxide are sequentially deposited 3000 to 4000 Å and 2000 to 4000 Å in respective thickness on the field insulating layer 37 and the interlevel insulating layer 45 using CVD. Additionally, the silicon oxide and the polysilicon are sequentially patterned with photolithography to overlap the floating gate 43 in a striped shape in the second direction to form a control gate 47 and a cap oxide layer 49, respectively.

In the preferred embodiment of a method of fabricating the flash memory cell according to the present invention, the field insulating layer having a plurality of contact holes in a matrix form on the substrate is formed based on the buried region having a striped shape in the first direction. Then, after paving the gate oxide layer and depositing the polysilicon doped with impurity, the polysilicon is etched-back to remain only in the contact hole formed on the field insulating layer, which forms the floating gate and simultaneously separates a device. Therefore, the fabrication processes can be simplified and the integration can be enhanced by self-aligning the floating gate in the contact hole.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a flash memory cell, comprising the steps of:
    ion-implanting an impurity into a substrate to form buried regions extending in a first direction;
    depositing an insulating layer on the substrate after ion-implanting the impurity;
    patterning the insulating layer to form a field insulating layer having a plurality of contact holes arranged in a matrix, wherein the contact holes expose the substrate;
    forming gate insulating layers on the exposed portions of the substrate in the contact holes;
    forming a floating gate on each of the gate insulating layers such that the floating gates an self-aligned in the contact holes;
    forming an interlevel insulating layer on each of the floating gates; and
    forming control gates extending in a second direction on the interlevel insulating layers, wherein the second direction crosses the first direction on the interlevel insulating layers.

2. The method of fabricating a flash memory cell according to claim 1, wherein a density of the flash memory cell is increased.

3. The method of fabricating a flash memory cell according to claim 1 wherein a planarity of a flash memory cell top surface is improved.

4. The method of fabricating a flash memory cell according to claim 1, wherein the buried regions and the control gates have striped shapes that are perpendicular.

5. The method of fabricating a flash memory cell according to claim 1, further comprising depositing an insulating layer on the substrate to form a mask layer before performing the ion-implanting step.

6. The method of fabricating a flash memory cell according to claim 5, wherein the field insulating layer is approximately between 4000 and 6000 Å in thickness.

7. The method of fabricating a flash memory cell according to claim 1, wherein lengthwise edges of adjacent buried regions are exposed in the step of forming the contact holes.

8. The method of fabricating a flash memory cell according to claim 1, wherein the gate insulating layer is approximately between 200 and 400 Å in thickness.

9. The method of fabricating a flash memory cell according to claim 1, wherein the step of forming the floating gate comprises the steps of:

depositing a polysilicon doped with impurity on the field insulating layer to fill the contact holes; and etching-back the polysilicon to expose the field insulating layer to form the floating gates in the contact holes.

10. The method of fabricating a flash memory cell according to claim 1, wherein the interlevel insulating layer is formed by treating a surface of the floating gates with thermal oxidation.

11. The method of fabricating a flash memory cell according to claim 1, wherein the interlevel insulating layer is formed by depositing silicon oxide on the floating gates.

12. The method of fabricating a flash memory cell according to claim 1, wherein interlevel insulating layer is approximately between 300 and 500 Å in thickness.

13. The method of fabricating a flash memory cell according to claim 1, further comprising depositing a silicon oxide on the control gates to form a cap oxide layer.

14. The method of claim 1, wherein the step of forming a floating gate on each of the gate insulating layers comprises forming the floating gates at a level above the buried regions.

15. A method of fabricating a flash memory cell, comprising the steps of:

exposing a substrate of a first conductivity type in a striped shape extendintg in a first direction;

implanting an impurity of a second conductivity type into the exposed substrate to form buried regions;

depositing an insulating layer on the substrate after implanting the impurity, and patterning the insulating layer to form a field insulating layer having a plurality of contact holes, arranged in a matrix, that expose the substrate;

forming a gate oxide layer by thermally oxidizing the substrate exposed in the contact holes;

depositing a polysilicon doped with an impurity on the field insulating layer including the contact hole and etching-back the deposited polysilicon, to form a floating gate self-aligned in the contact holes;

forming an interlevel insulating layer on the floating gates; and forming control gates extending in a second direction on the interlevel insulating layer, wherein the second direction crosses the first direction.

16. The method of claim 15, wherein a density of the flash memory cell is increased.

17. The method of claim 15, wherein the buried regions and the control gates have striped shapes that are perpendicular.

18. The method of claim 15, further comprising a step of depositing a silicon oxide on the control gates to form a cap oxide layer.

19. The method of claim 15, wherein the step of depositing a polysilicon doped with an impurity on the field insulating layer comprises depositing the polysilicon at a level above the buried regions so that floating gates, self-aligned in the contact holes, are formed at a level above the buried regions.

20. A method of forming a flash memory cell, comprising the steps of:

forming a plurality of source and drain regions in a substrate;

depositing an insulating layer on the substrate after forming the source and drain regions;

patterning the insulating layer to create a plurality of contact holes, arranged in a matrix, that expose portions of the substrate between adjacent source and drain regions, wherein the patterned insulating layer also forms a field insulating layer that defines active regions of the substrate;

forming gate oxide layers on the exposed portions of the substrate in the contact holes;

forming floating gates that are self-aligned in the contact holes, and that are arranged at a level above the source and drain regions;

forming an interlevel insulating layer on the floating gates; and forming control gates on the interlevel insulating layer.

21. The method of claim 20, wherein the patterning step also exposes top surface portions of the substrate that are positioned over edges of adjacent source and drain regions.

* * * * *